(12) United States Patent
Park

(10) Patent No.: US 7,170,803 B2
(45) Date of Patent: Jan. 30, 2007

(54) CURRENT REDUCTION CIRCUIT OF SEMICONDUCTOR DEVICE

(75) Inventor: Sang Il Park, Icheon-shi (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 11/275,421

(22) Filed: Dec. 30, 2005

(65) Prior Publication Data

US 2007/0002666 A1 Jan. 4, 2007

(30) Foreign Application Priority Data

Jun. 29, 2005 (KR) ............... 10-2005-0057353

(51) Int. Cl.
*G11C 29/00* (2006.01)

(52) U.S. Cl. .................... 365/200; 365/195
(58) Field of Classification Search ............ 365/200, 365/195, 196

See application file for complete search history.

(56) References Cited

U.S. PATENT DOCUMENTS

| 5,970,002 | A  | * | 10/1999 | Yoo ........................ 365/200 |
| 6,396,754 | B1 | * | 5/2002  | Lee et al. ................ 365/201 |
| 6,850,453 | B2 |   | 2/2005  | Park |
| 6,944,076 | B2 |   | 9/2005  | Nakamura et al. |
| 6,946,903 | B2 |   | 9/2005  | Marshall et al. |
| 2006/0007753 | A1 | * | 1/2006 | Choi et al. .......... 365/189.01 |

* cited by examiner

*Primary Examiner*—Vu A. Le
(74) *Attorney, Agent, or Firm*—Marshall, Gerstein & Borun LLP

(57) ABSTRACT

A current reduction circuit of a semiconductor device is disclosed which includes an enabling signal generator which outputs a predetermined enabling signal in association with a cell block in which a bridge has been formed between a word line and a bit line, and an isolation controller which is enabled in response to the enabling signal, and outputs a control signal to periodically isolate the bridge-formed cell block from a sense amplifier array for a predetermined period in a standby mode in response to a periodic signal enabled at intervals of a predetermined time.

16 Claims, 5 Drawing Sheets

CURRENT REDUCTION CIRCUIT OF SEMICONDUCTOR DEVICE

FIELD OF THE INVENTION

This patent relates to a current reduction circuit of a semiconductor device, and, more particularly, to a current reduction circuit of a semiconductor device which is capable of reducing the amount of current leaked through a region where a bridge is formed between a bit line and a word line in association with a particular cell in the semiconductor device, in a standby mode.

DESCRIPTION OF THE RELATED ART

Recently-developed semiconductor devices have a reduced element area due to high integration thereof. In particular, in the case of a dynamic random access memory (DRAM) device, there is an increased possibility of a phenomenon where a bridge is formed between a bit line and a word line in the process of manufacturing the semiconductor device due to a reduction in the pitch of the gates in the semiconductor device. The formation of the bridge between the word line and the bit line is mainly caused by a gate residue, namely, polysilicon remaining after etching of a polysilicon film to form a gate, or undesirable removal of a nitride film on the gate during a chemical mechanical polishing (CMP) process, and thus, weakness of the corresponding region.

FIG. 1 is a sectional view illustrating formation of a bridge between a word line and a bit line in a semiconductor device. As shown in FIG. 1, when a bridge is formed between a word line and a bit line, a current path is established between the word line and the bit line. As a result, charges in the bit line flow along the current path in a standby mode of the semiconductor device. Thus, undesirable current leakage is generated between the word line and the bit line in the standby mode. Of course, it may be possible to prevent erroneous operations caused by formation of a bridge by substituting the fail cell, in which the bridge is formed, with a redundant cell. In this case, however, the fail cell still remains in the semiconductor device, so that leakage current still flows through the fail cell.

FIG. 2 is a graph depicting an amount of leakage current generated due to generation of errors in rows/columns caused by a bridge generated between a word line and a bit line. Referring to FIG. 2, it can be seen that the amount of leakage current is increased depending on the number of fail rows/columns caused by fail cells. The leakage current unnecessarily consumed per fail cell is about 9 µA which corresponds to 7 to 10% of the limit value specified in the Standard Specification for standby current in low-power semiconductor devices. Increase in leakage current caused by a bridge formed between a word line and a bit line adversely affects the current characteristics of the semiconductor device. Thus, such a leakage current increase serves as the main factor to degrade the throughput of the semiconductor device.

SUMMARY OF THE INVENTION

A pre-charge voltage supply circuit of a semiconductor device is capable of reducing the amount of current leaked through a region where a bridge is formed between a bit line and a word line in association with a particular cell in the semiconductor device, in a standby mode.

A current reduction circuit of a semiconductor device may include an enabling signal generator which outputs a predetermined enabling signal in association with a cell block in which a bridge has been formed between a word line and a bit line; and an isolation controller which is enabled in response to the enabling signal, and outputs a first control signal to periodically isolate the bridge-formed cell block from a sense amplifier array for a predetermined period in a standby mode in response to a periodic signal enabled at intervals of a predetermined time.

The current reduction circuit may be arranged in the semiconductor device such that the current reduction circuit operates for the associated cell block which is one of the cell blocks of the semiconductor device.

The enabling signal generator may output the enabling signal in accordance with breakage of a fuse carried out when it is determined that the bridge has been formed.

The enabling signal generator may comprise a fuse which is arranged between a predetermined voltage input terminal and a first node, and is broken when it is determined that the bridge has been formed, a pull-down unit which pulls down the first node in response to a second control signal, a buffer which buffers a signal from the first node, and a latch which latches an output signal from the buffer.

The second signal may be a power-up signal for the semiconductor device.

The buffer may be an inverse buffer.

The latch may comprise a pull-down device which is enabled in response to an output signal from the buffer, and pulls down the first node.

The isolation controller may comprise a first buffer which buffers the periodic signal, a delay which delays an output signal from the first buffer for a predetermined period, a first logic unit which logically operates the output signal from the first buffer and an output signal from the delay, and a second buffer which is enabled in response to the enabling signal, and buffers an output signal from the first logic unit.

The isolation controller may further comprise a latch which latches an output signal from the second buffer, and a second logic unit which logically operates a predetermined block select signal and an output signal from the latch.

The isolation controller may further comprise an initializer which initializes an output terminal of the second buffer in response to a predetermined power-up signal.

The initializer may be a pull-down device which pulls down the output terminal of the second buffer in response to the power-up signal.

The second logic unit may perform an ANDing operation.

The first logic unit may perform an ANDing operation.

Each of the first and second buffers may be an inverse buffer.

The current reduction circuit may further comprise at least one isolation switch which isolates the bridge-formed cell block from the sense amplifier array in response to the first control signal.

The periodic signal may be a self-refresh signal for the semiconductor device.

BRIEF DESCRIPTION OF THE DRAWINGS

Various features and advantages of the present invention will become more apparent after reading the following detailed description when taken in conjunction with the drawings, in which.

DESCRIPTION OF THE PREFERRED EMBODIMENTS

Hereinafter, the present invention will be described in detail, in conjunction with exemplary embodiments. These embodiments are used only for illustrative purposes, and the present invention is not limited thereto.

Figure 1:
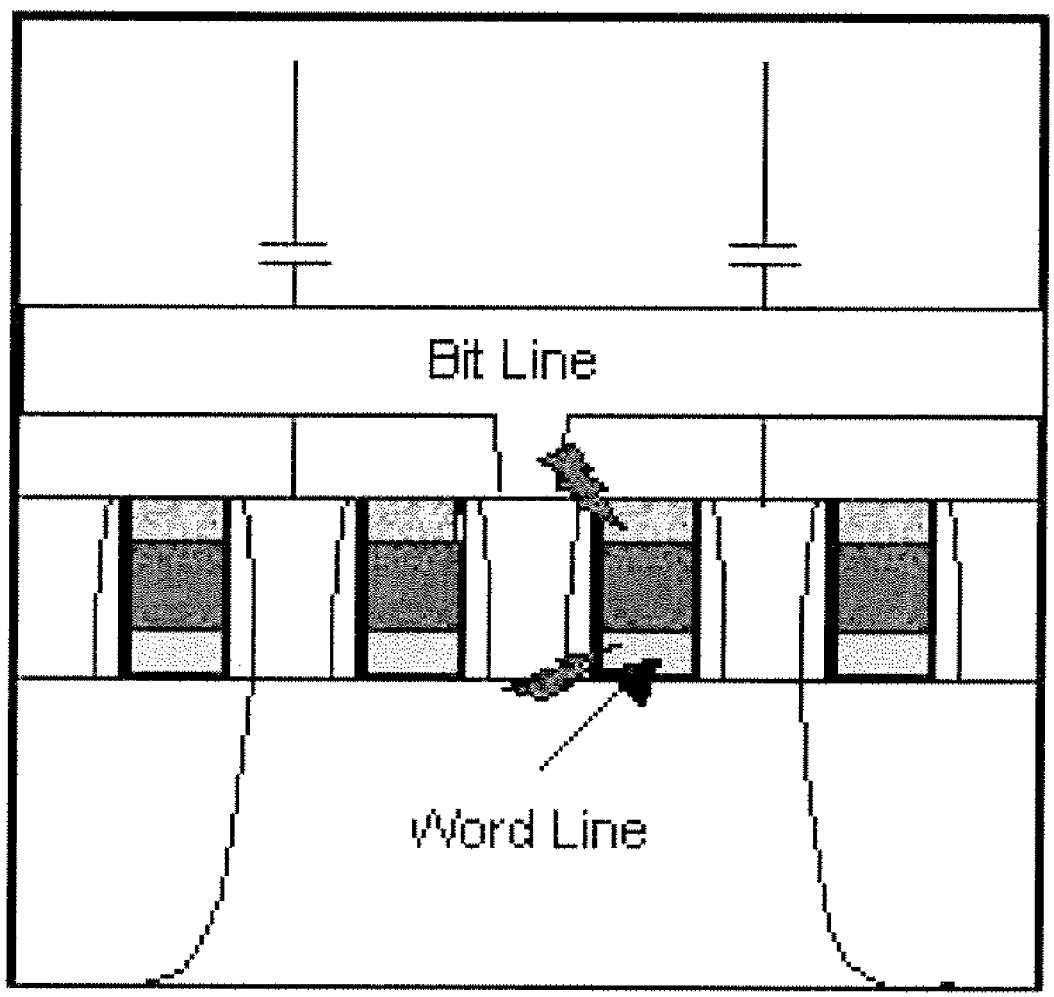
FIG. 1 is a sectional view illustrating formation of a bridge between a word line and a bit line in a semiconductor device.
Figure 2:
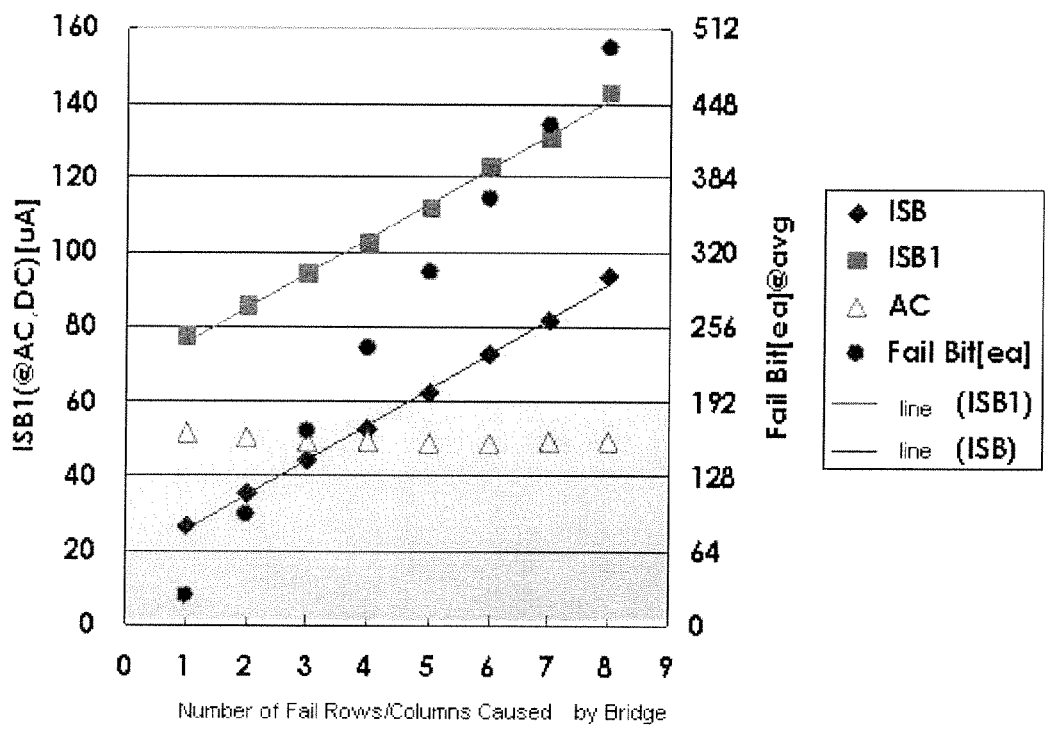
FIG. 2 is a graph depicting an amount of leakage current generated due to generation of errors in rows/columns caused by a bridge generated between a word line and a bit line.
Figure 3:
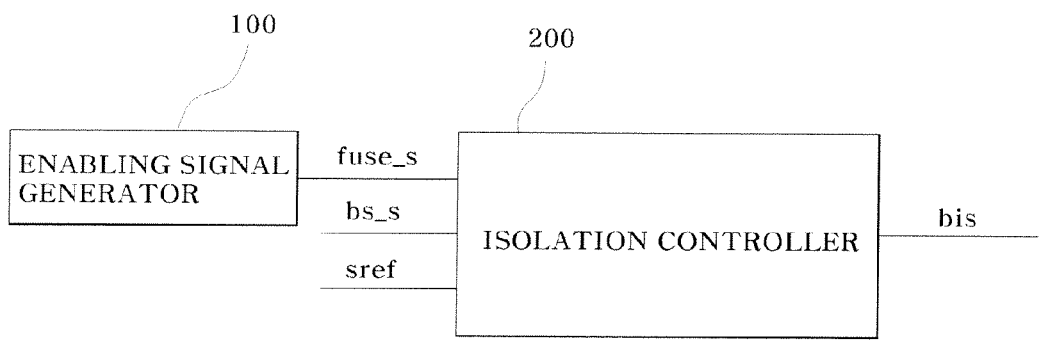
FIG. 3 is a block diagram illustrating a configuration of a current reduction circuit of a semiconductor device according to an embodiment of the present invention.
Figure 4:
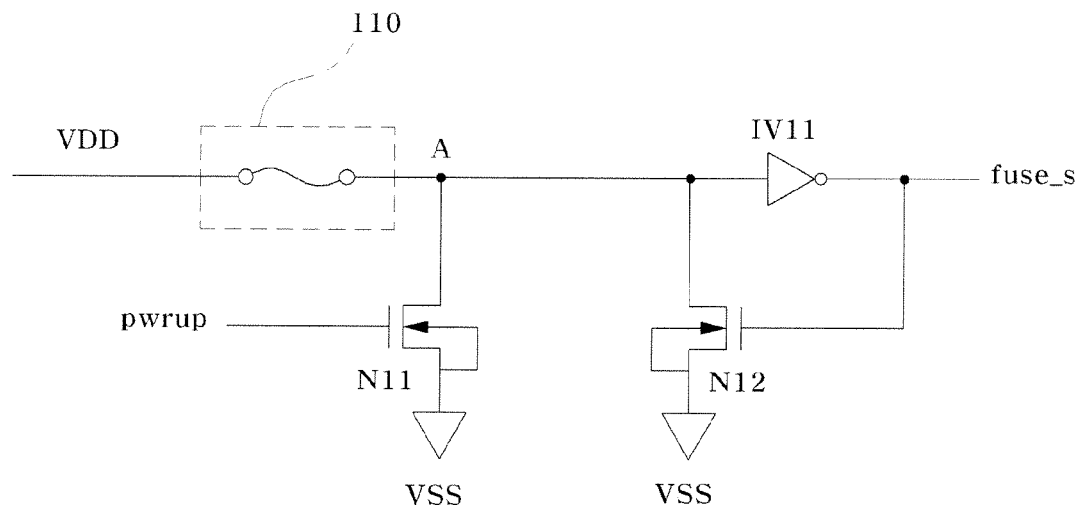
FIG. 4 is a circuit diagram illustrating a configuration of an enabling signal generator used in the current reduction circuit according to the illustrated embodiment of the present invention.
Figure 5:
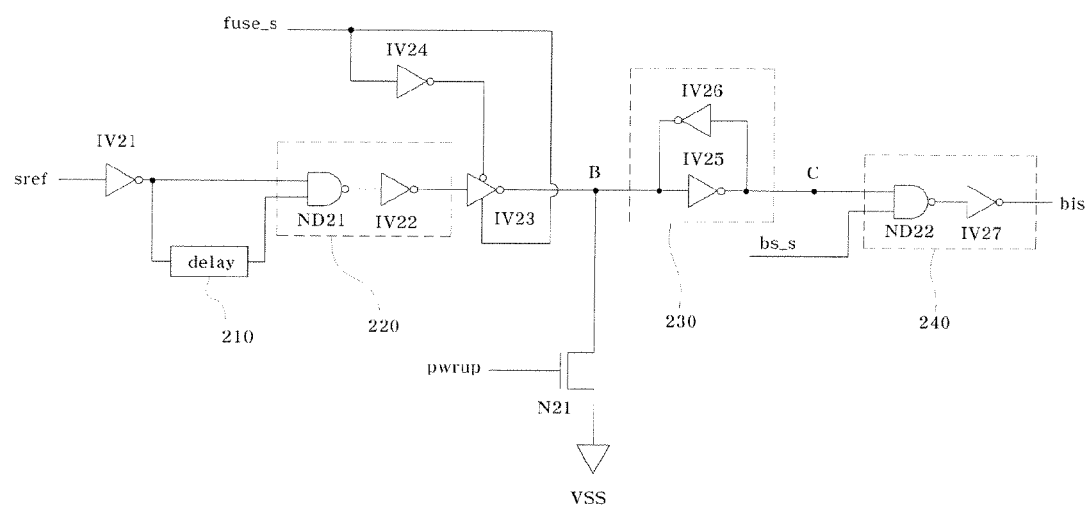
FIG. 5 is a circuit diagram illustrating a configuration of an isolation controller used in the current reduction circuit according to the illustrated embodiment of the present invention.

FIG. 3 illustrates a configuration of a current reduction circuit of a semiconductor device according to an embodiment of the present invention. FIG. 4 illustrates a configuration of an enabling signal generator used in the current reduction circuit according to the illustrated embodiment of the present invention. FIG. 5 illustrates a configuration of an isolation controller used in the current reduction circuit according to the illustrated embodiment of the present invention. Hereinafter, the present invention will be described with reference to the drawings.

As shown in FIG. 3, the current reduction circuit of the semiconductor device according to the illustrated embodiment of the present invention includes an enabling signal generator 100 which outputs a predetermined enabling signal fuse_s in association with a cell block in which a bridge has been formed between a word line and a bit line, and an isolation controller 200 which is enabled in response to the enabling signal fuse_s, and periodically isolates the bridge-formed cell block from a sense amplifier array for a predetermined period in a standby mode in response to a self-refresh signal sref which is a periodic signal enabled at intervals of a predetermined time.

As shown in FIG. 4, the enabling signal generator 100 includes a fuse 110 which is arranged between an external voltage input terminal VDD and a node A, and is broken when it is determined that a bridge has been formed in the associated cell block, an n-channel metal oxide semiconductor (NMOS) transistor N11 which pulls down the node A in response to a power-up signal pwrup, an inverter IV11 which inversely buffers a signal from the node A, and an NMOS transistor N12 which latches an output signal from the inverter IV11. As shown in FIG. 5, the isolation controller 200 includes an inverter IV21 which inversely buffers the self-refresh signal sref, a delay 210 which delays an output signal from the inverter IV21 for a predetermined period, a logic unit 220 which ANDs the output signal from the inverter IV21 and an output signal from the delay 210, an inverter IV23 which is enabled in response to the enabling signal fuse_s, and inversely buffers an output signal from the logic unit 220, a latch 230 which latches an output signal from the inverter IV23, and a logic unit 240 which ANDs a predetermined block select signal bs_s and an output signal from the latch 230.

Operation of the current reduction circuit having the above-described configuration will be described in detail with reference to FIGS. 3 to 8. The following description will be given in association with two operation modes of the semiconductor device, namely, an active mode and a standby mode. Here, "active mode" means an operation mode in which active operations such as input and output of data are executed, and "standby mode" means a low power consumption mode in which the semiconductor device is in a standby state to reduce power consumption before initiation of the active mode.

First, operation in the active mode will be described. When the semiconductor device enters the active mode, the block select signal bs_s for selection of a particular cell block, as shown in FIG. 5, is transited from a high level to a low level. Accordingly, the logic unit 240, which is adapted to perform an ANDing operation, outputs a low-level control signal bis irrespective of the self-refresh signal sref and enabling signal fuse_s. As a result, the selected cell block is isolated from other cell blocks neighboring the selected cell block. For example, in FIG. 6, when a block select signal bs_s is input to a third isolation controller 200 associated with a cell block 3, in a state of being transited to a low level in the active mode, the third isolation controller 200 outputs a control signal bis3 transited to a low level. Accordingly, isolation switches, namely, NMOS transistors, connected between a sense amplifier array 302 and a cell block 2 are turned off without exception. Also, isolation switches, namely, NMOS transistors, connected between a sense amplifier array 303 and a cell block 4 are turned off without exception. As a result, only the cell block 3 is selected, so that a data input or output operation is carried out only for the selected cell block 3. Thus, in the active mode, a particular cell block is selected in accordance with an associated block select signal bs_s transited from a high level to a low level, so that a data input or output operation is carried out for the selected cell block.

Next, operation in the standby mode prior to the initiation of the active mode will be described. As shown in FIG. 3, the isolation controller 200 receives the enabling signal fuse_s from the enabling signal generator 100, together with the block select signal bs_s and self-refresh signal sref, thereby outputting a control signal bis.

First, operation of the enabling signal generator 100 will be described. As shown in FIG. 4, the enabling signal generator 100 outputs an enabling signal fuse_s which is transited in level in accordance with whether or not the fuse 110 was broken. In general semiconductor architecture, there are a plurality of cell blocks per bank. In such semiconductor architecture, at least one enabling signal generator is preferably provided for each cell block.

Whether or not the fuse 110 is to be broken is determined in accordance with the results of a probe test performed to determine whether or not a bridge has been formed between a word line and a bit line. For a cell block determined to have a bridge formed between a word line and a bit line, the associated fuse 100 is determined to be broken. On the other hand, for a cell block determined to have no bridge formed between a word line and a bit line, the associated fuse 100 is determined to be prevented from being broken.

If a bridge is formed between a word line and a bit line in an optional cell block, the associated fuse 110 is broken. In this state, as shown in FIG. 4, the node A is transited to a low level by the NMOS transistor N11 which is turned on in response to a power-up signal pwrup. As a result, the enabling signal fuse_s is transited to a high level, namely, an enabled state. In this state, the NMOS transistor N12 is turned on by the high-level enabling signal fuse_s, to maintain the node A in a low-level state. On the other hand, where there is no bridge formed between a word line and a bit line in an optional cell block, the associated fuse 110 is not broken. In this state, as shown in FIG. 4, an external voltage VDD is applied to the node A, so that the node A is transited to a high level. As a result, the enabling signal fuse_s is transited to a low level, namely, a disable state. Thus, the enabling signal generator 100 outputs an enabling signal fuse_s of a high-level or low-level in accordance with whether or not a bridge has been formed in the associated cell block, and thus, whether or not the fuse 110 was broken.

Figure 7:
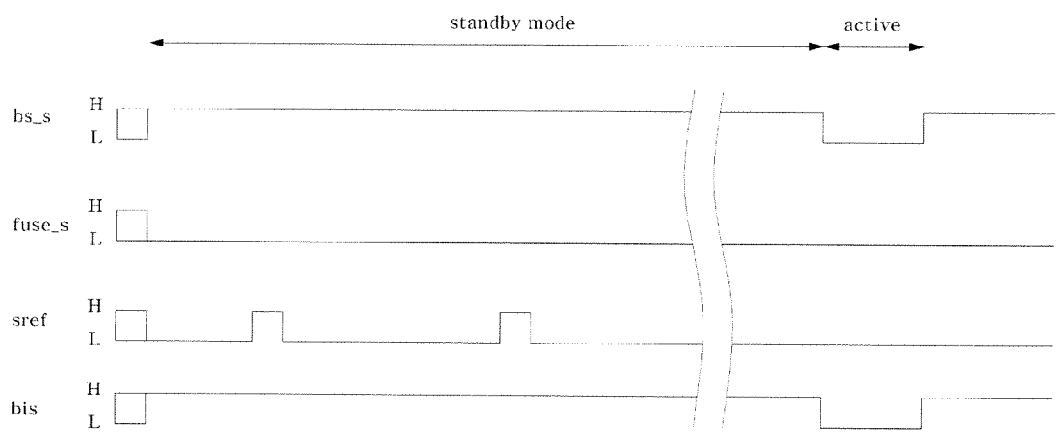
FIG. 7 is a timing diagram of signals associated with operation of the current reduction circuit according to the illustrated embodiment of the present invention for a cell block in which no bridge has been formed.

Next, operation of the isolation controller 200 will be described. As shown in FIG. 5, the isolation controller 200 receives the self-refresh signal sref, enabling signal fuse_s, and block select signal bs_s, thereby outputting a control signal bis. The self-refresh signal sref is periodically enabled to enable self refresh in the standby mode. Although the self-refresh signal sref is used in the illustrated embodiment, other signals may be used so far as they can be periodically enabled. Meanwhile, in the standby mode, the block select signal bs_s is maintained in a high-level state because a data input or output operation is not carried out.

Where there is no bridge formed in an optional cell block, the enabling signal fuse_s, which is applied to the isolation controller 200 as shown in FIG. 5, has a low level. Accordingly, the inverter IV23 is turned off, so that the node B is initialized to be in a low-level state by the NMOS transistor N21 which is enabled by the power-up signal pwrup. Also, the node C is maintained in a high-level state by the inverter IV25, so that the control signal bis output from the logic unit 240 has a high level, as shown in FIG. 7. Accordingly, the isolation switches connected between the cell block and the sense amplifier array associated with the cell block are maintained in an ON state. In this state, the bit lines of the cell block are maintained at a voltage level corresponding to, for example, Vcore/2. Here, "Vcore" is a pre-charge voltage.

Figure 8:
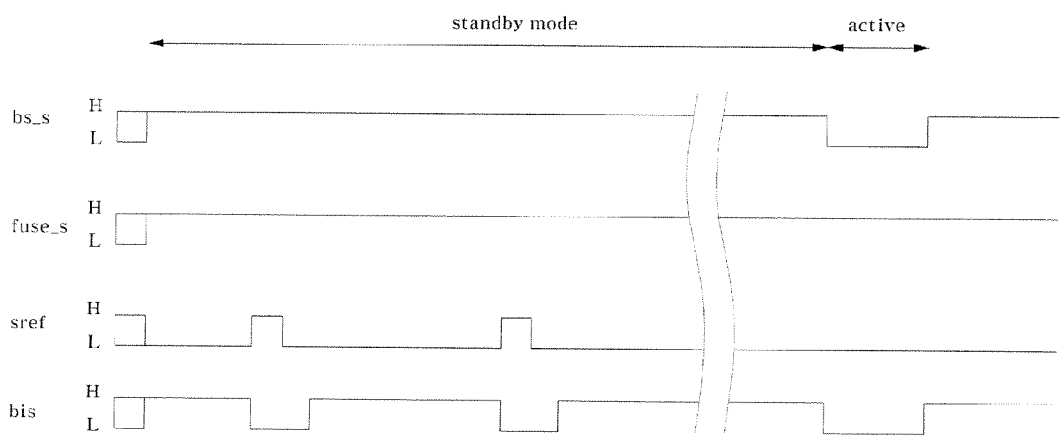
FIG. 8 is a timing diagram of signals associated with operation of the current reduction circuit according to the illustrated embodiment of the present invention for a cell block in which a bridge has been formed.

On the other hand, if a bridge is formed in the cell block, the enabling signal fuse_s has a high level. Accordingly, the inverter IV23 is turned on. Accordingly, the control signal bis is maintained at a low level for a predetermined time in accordance with input of the self-refresh signal sref, as shown in FIG. 8. This will be described in more detail.

First, in a period before the self-refresh signal sref is transited to a high level, namely, an enabled state, the logic unit 220 constituted by the NAND gate ND21 and inverter IV22 receives two high-level signals, thereby outputting a high-level signal. Accordingly, the inverter IV23 outputs a low-level signal to the node B. As a result, the node C is maintained in a high-level state, and the control signal bis has a high level. Thus, the control signal bis is maintained in a high-level state in a period before the self-refresh signal sref is transited to a high level, namely, an enabled state.

When the self-refresh signal sref is subsequently transited from a low level to a high level, namely, an enabled state, a low-level signal is input to one input terminal of the NAND gate ND21. Accordingly, the logic unit 220 outputs a low-level signal, so that the inverter IV23 outputs a high-level signal. As a result, the control signal bis output from the logic unit 240 is transited to a low level.

Meanwhile, for the period delayed by the delay 210, the signal output from the delay 210 is still in a previous state, namely, a high-level state. The signal output from the delay 210 is transited to a low level, immediately before the self-refresh signal sref is transited to a low level. Accordingly, although the self-refresh signal sref is subsequently re-transited from a high level to a low level, the logic unit 20 still outputs the low-level signal for a predetermined period, namely, the delay period, because it still receives the low-level signal from the delay 210. As a result, the control signal bis output from the isolation controller 200 for the predetermined period has a low level, as shown in FIG. 8. In response to the low-level control signal bis, the isolation switches connected between the bridge-formed cell block and the associated sense amplifier array are turned off, thereby isolating the cell block and sense amplifier array, and thus, preventing leakage current from flowing through the bridge-formed region.

Even when the signal output from the delay 210 is subsequently transited to a high level, the logic unit 220 outputs a high-level signal because it receives high-level signals at both input terminals thereof. As a result, the control signal bis is transited from a low level to a high level, as shown in FIG. 8.

The amount of leakage current cut off for the period in which the control signal bis is maintained at a low level is expressed by the following Expression 1:

$$I_{leakage} = C \times (dV/dt) \times N \qquad \text{[Expression 1]}$$

where,

V: Vcore/2, dt: Current cut-off period

N: Number of enabled times of self refresh signal sref

C: Bit line capacitance and sense amplifier capacitance

Figure 6:
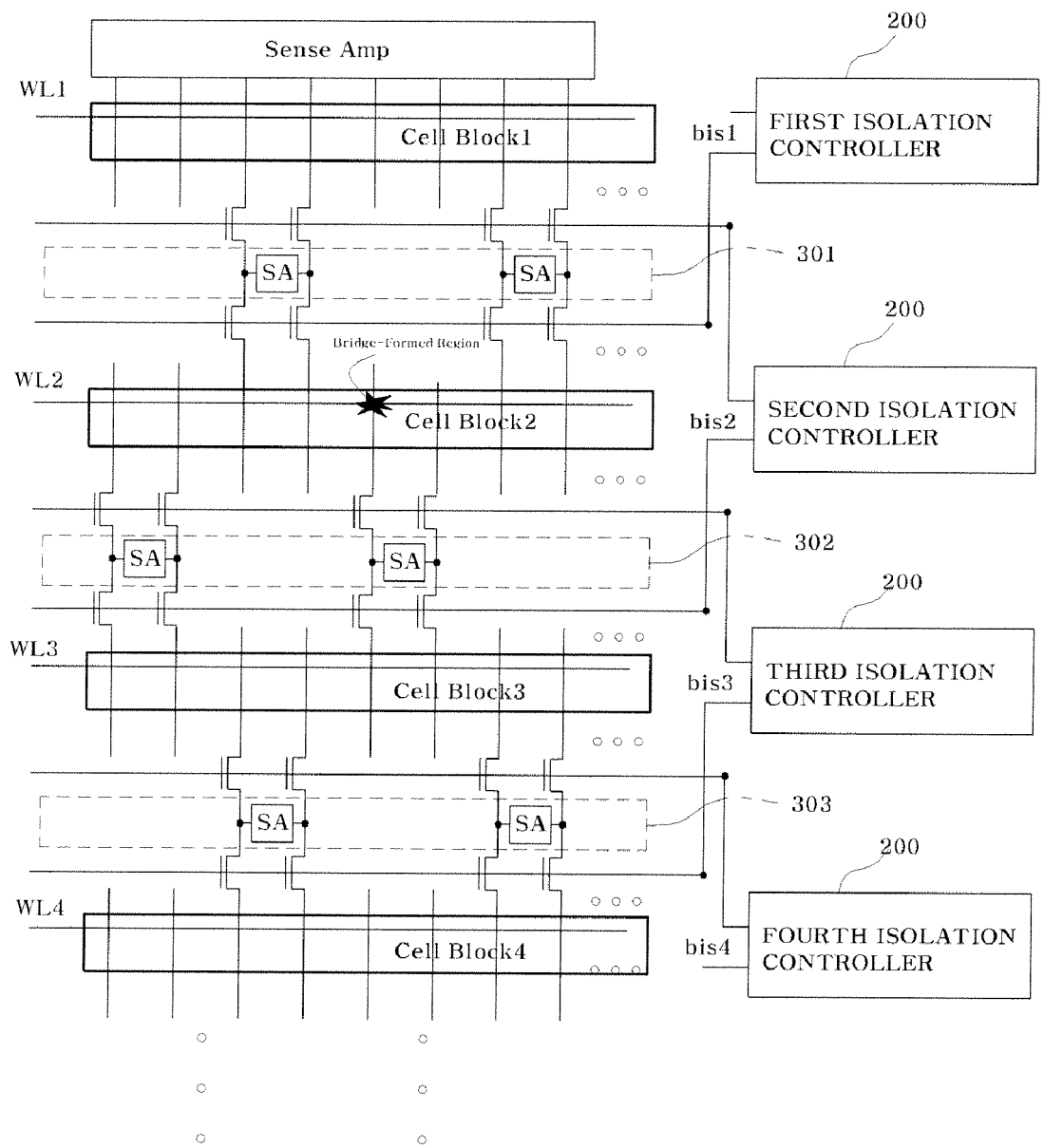
FIG. 6 is a schematic view illustrating the architecture of the semiconductor device using the current reduction circuit according to the illustrated embodiment of the present invention.

For example, in a shared sense amplification scheme in which two neighboring cell blocks are driven by one sense amplifier, as shown in FIG. 6, it is possible to reduce leakage current by the amount of current expressed by the above Expression 1 when a bridge has been formed in a cell block, for example, the cell block 2, by periodically disabling the control signal bis3 and/or the control signal bis1 for a predetermined period to turn off the isolation switches between the cell block and the sense amplifier array. This method, in which the isolation switches between the cell block and the sense amplifier array are periodically turned off in the standby mode, may also be applied to memory architectures other than the memory architecture using the shared sense amplification scheme.

As described above, in accordance with the current reduction circuit according to the illustrated embodiment, a particular cell block is selected in accordance with a block select signal in an active mode to enable a data input or output operation for the selected cell block, and the bridge-formed cell block is periodically isolated from the associated sense amplifier array for a predetermined period in a standby mode. Accordingly, it is possible to reduce the amount of current leaked through the bridge-formed region in the standby mode. Thus, an enhancement in the electric power efficiency of the semiconductor device is achieved.

As apparent from the above description, the present invention provides a current reduction circuit of a semiconductor device which is capable of reducing the amount of current leaked through a region where a bridge is formed between a bit line and a word line in association with a particular cell in the semiconductor device, in a standby mode, thereby achieving an enhancement in the electric power efficiency of the semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A current reduction circuit of a semiconductor device comprising:
    an enabling signal generator which outputs a predetermined enabling signal in association with a cell block in which a bridge has been formed between a word line and a bit line; and
    an isolation controller which is enabled in response to the enabling signal, and outputs a first control signal to periodically isolate the bridge-formed cell block from a sense amplifier array for a predetermined period in a standby mode in response to a periodic signal enabled at intervals of a predetermined time.

2. The current reduction circuit according to claim 1, wherein the current reduction circuit is arranged in the semiconductor device such that the current reduction circuit operates for an associated cell block which is one of cell blocks of the semiconductor device.

3. The current reduction circuit according to claim 1, wherein the enabling signal generator outputs the enabling signal responsive to a state of a fuse associated with the formation of the bridge.

4. The current reduction circuit according to claim 3, wherein the enabling signal generator comprises:
    a fuse which is arranged between a predetermined voltage input terminal and a first node, the fuse being breakable when it is determined that the bridge has been formed;
    a pull-down unit which pulls down the first node in response to a second control signal;
    a buffer which buffers a signal from the first node; and
    a latch which latches an output signal from the buffer.

5. The current reduction circuit according to claim 4, wherein the second control signal is a power-up signal for the semiconductor device.

6. The current reduction circuit according to claim 4, wherein the buffer is an inverter.

7. The current reduction circuit according to claim 4, wherein the latch comprises a pull-down device which is enabled in response to an output signal from the buffer, and pulls down the first node.

8. The current reduction circuit according to claim 1, wherein the isolation controller comprises:
    a first buffer which buffers the periodic signal;
    a delay which delays an output signal from the first buffer for a predetermined period;
    a first logic unit which logically operates the output signal from the first buffer and an output signal from the delay; and
    a second buffer which is enabled in response to the enabling signal, and buffers an output signal from the first logic unit.

9. The current reduction circuit according to claim 8, wherein the isolation controller further comprises:
    a latch which latches an output signal from the second buffer; and
    a second logic unit which logically operates a predetermined block select signal and an output signal from the latch.

10. The current reduction circuit according to claim 9, wherein the isolation controller further comprises:
    an initializer which initializes an output terminal of the second buffer in response to a predetermined power-up signal.

11. The current reduction circuit according to claim 10, wherein the initializer is a pull-down device which pulls down the output terminal of the second buffer in response to the power-up signal.

12. The current reduction circuit according to claim 9, wherein the second logic unit performs an ANDing operation.

13. The current reduction circuit according to claim 8, wherein the first logic unit performs an ANDing operation.

14. The current reduction circuit according to claim 8, wherein each of the first and second buffers is an inverter.

15. The current reduction circuit according to claim 1, further comprising:
    at least one isolation switch which isolates the bridge-formed cell block from the sense amplifier array in response to the first control signal.

16. The current reduction circuit according to claim 1, wherein the periodic signal is a self-refresh signal for the semiconductor device.

* * * * *